(12) United States Patent
Huang et al.

(10) Patent No.: US 8,987,025 B2
(45) Date of Patent: *Mar. 24, 2015

(54) METHOD FOR MANUFACTURING LIGHT EMITTING DIODE

(71) Applicant: Advanced Optoelectronic Technology, Inc., Hsinchu Hsien (TW)

(72) Inventors: Chia-Hung Huang, Hsinchu (TW); Shih-Cheng Huang, Hsinchu (TW); Po-Min Tu, Hsinchu (TW); Ya-Wen Lin, Hsinchu (TW); Shun-Kuei Yang, Hsinchu (TW)

(73) Assignee: Zhongshan Innocloud Intellectual Property Services Co., Ltd., Guangdong (CN)

( * ) Notice: Subject to any disclaimer, the term of this patent is extended or adjusted under 35 U.S.C. 154(b) by 0 days.

This patent is subject to a terminal disclaimer.

(21) Appl. No.: 14/071,668

(22) Filed: Nov. 5, 2013

(65) Prior Publication Data

US 2014/0065745 A1 Mar. 6, 2014

Related U.S. Application Data

(62) Division of application No. 13/600,137, filed on Aug. 30, 2012, now Pat. No. 8,604,503.

(30) Foreign Application Priority Data

Mar. 6, 2012 (CN) .......................... 2012 1 0559844

(51) Int. Cl.
*H01L 21/205* (2006.01)
*H01L 21/302* (2006.01)
(Continued)

(52) U.S. Cl.
CPC ................ *H01L 33/58* (2013.01); *H01L 33/10* (2013.01); *H01L 33/22* (2013.01); *H01L 33/32* (2013.01)
USPC ..................................... 438/29; 257/E33.068

(58) Field of Classification Search
None
See application file for complete search history.

(56) References Cited

U.S. PATENT DOCUMENTS 7,957,621 B2 6/2011 Zhang et al.
8,604,503 B2 * 12/2013 Huang et al. .................... 257/98
(Continued)

FOREIGN PATENT DOCUMENTS

TW I269466 12/2006

OTHER PUBLICATIONS

Kim, Keun-Joo. "Nanopatterned Surface Effect on the Epitaxial Growth of InGaN/GaN Multi-quantum Well Light Emitting Diode Structure." Transactions on Electrical and Electronic Materials 10.2 (2009): 40-43.*

(Continued)

*Primary Examiner* — Joseph Schoenholtz
(74) *Attorney, Agent, or Firm* — Novak Druce Connolly Bove + Quigg LLP

(57) ABSTRACT

A manufacturing method for an LED (light emitting diode) includes following steps: providing a substrate; disposing a transitional layer on the substrate, the transitional layer comprising a planar area with a flat top surface and a patterned area with a rugged top surface; coating an aluminum layer on the transitional layer; using a nitriding process on the aluminum layer to form an AlN material on the transitional layer; disposing an epitaxial layer on the transitional layer and covering the AlN material, the epitaxial layer contacting the planar area and the patterned area of the transitional layer, a plurality of gaps being defined between the epitaxial layer and the slugs of the second part of the AlN material in the patterned area of the transitional layer.

14 Claims, 8 Drawing Sheets

(51) Int. Cl.
  *H01L 21/329* (2006.01)
  *H01L 33/58* (2010.01)
  *H01L 33/10* (2010.01)
  *H01L 33/22* (2010.01)
  *H01L 33/32* (2010.01)

(56) References Cited

U.S. PATENT DOCUMENTS

2005/0257733 A1  11/2005  Nakahata
2007/0241352 A1  10/2007  Yasuda et al.
2010/0055883 A1*  3/2010  Choi et al. .................... 438/481

OTHER PUBLICATIONS

Liu, Zhiqiang, Jun Ma, Xiaoyan Yi, Enqing Guo, Liancheng Wang, Junxi Wang, Na Lu, Jinmin Li, Ian Ferguson, and Andrew Melton. "P-InGaN/AlGaN Electron Blocking Layer for InGaN/GaN Blue Light-emitting Diodes." Applied Physics Letters 101.26 (2012): 261106.*

Meng-Fu Shih; Yung-Hsiang Lin; Chun-Wei Liao; Cheng-Ying Yen; Chou, Yi-Lun; Lin, Ray-Ming, "Minor magnesium doping in P-type layer of InGaN/GaN MQW LED to enhance electrical and optical properties," Semiconductor Device Research Symposium, 2007 International , vol., No., pp. 1,2, Dec. 12-14, 2007.*

* cited by examiner

US 8,987,025 B2

METHOD FOR MANUFACTURING LIGHT EMITTING DIODE

CROSS-REFERENCE TO RELATED APPLICATIONS

This patent application is a divisional application of patent application Ser. No. 13/600,137, filed on Aug. 30, 2012, entitled "LIGHT EMITTING DIODE AND MANUFACTURING METHOD THEREOF", assigned to the same assignee, which is based on and claims priority from Chinese Patent Application No. 201210055984.4, filed in China on Mar. 6, 2012, and disclosures of both related applications are incorporated herein by reference in their entireties.

BACKGROUND

1. Technical Field

The disclosure relates to LEDs (light emitting diodes), and more particularly to an LED with high light emitting efficiency and a manufacturing method of the LED.

2. Description of Related Art

LEDs have low power consumption, high efficiency, quick reaction time, long lifetime, and the absence of toxic elements such as mercury during manufacturing. Due to those advantages, traditional light sources are gradually replaced by LEDs. LEDs are capable of converting electrons into photons to emit radiant light at a certain spectrum out of the LEDs. The LEDs each include a substrate for disposing a light emitting layer. However, a part of radiant light emitted from the light emitting layer may be absorbed by the substrate, which is located under the light emitting layer. Such that, a light emitting intensity of the LED may be reduced.

Therefore, an LED and a manufacturing method of the LED that overcome aforementioned deficiencies are required.

BRIEF DESCRIPTION OF THE DRAWINGS

Many aspects of the disclosure can be better understood with reference to the drawings. The components in the drawings are not necessarily drawn to scale, the emphasis instead being placed upon clearly illustrating the principles of the present mounting apparatus for storage device. Moreover, in the drawings, like reference numerals designate corresponding parts throughout the views.

DETAILED DESCRIPTION

Figure 1:
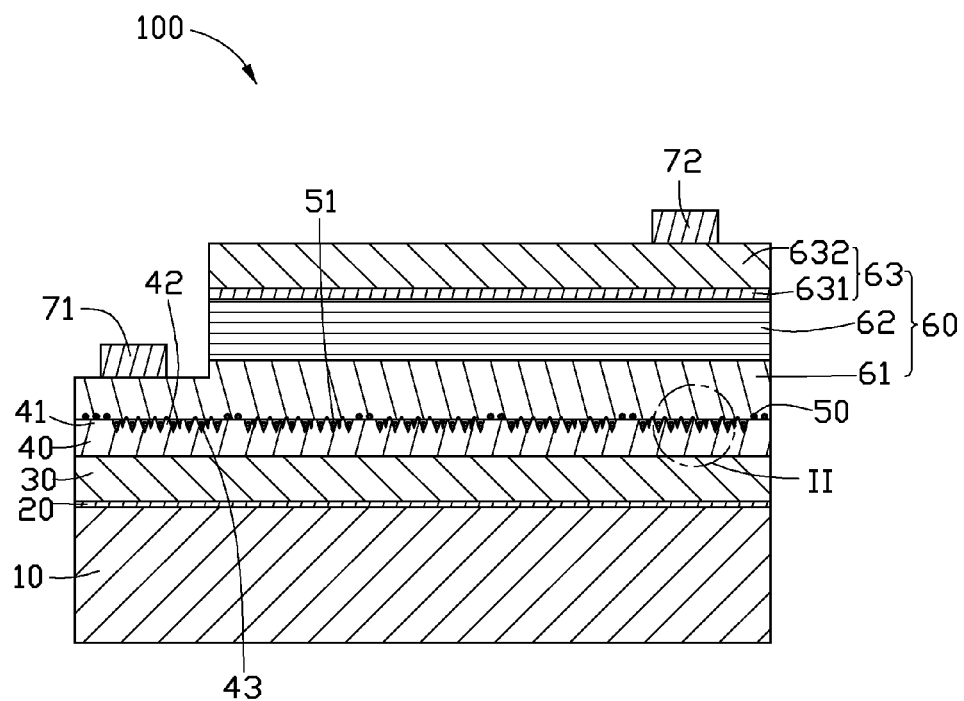
FIG. 1 is a cross-sectional view of an LED in accordance with an embodiment of the disclosure.
Figure 2:
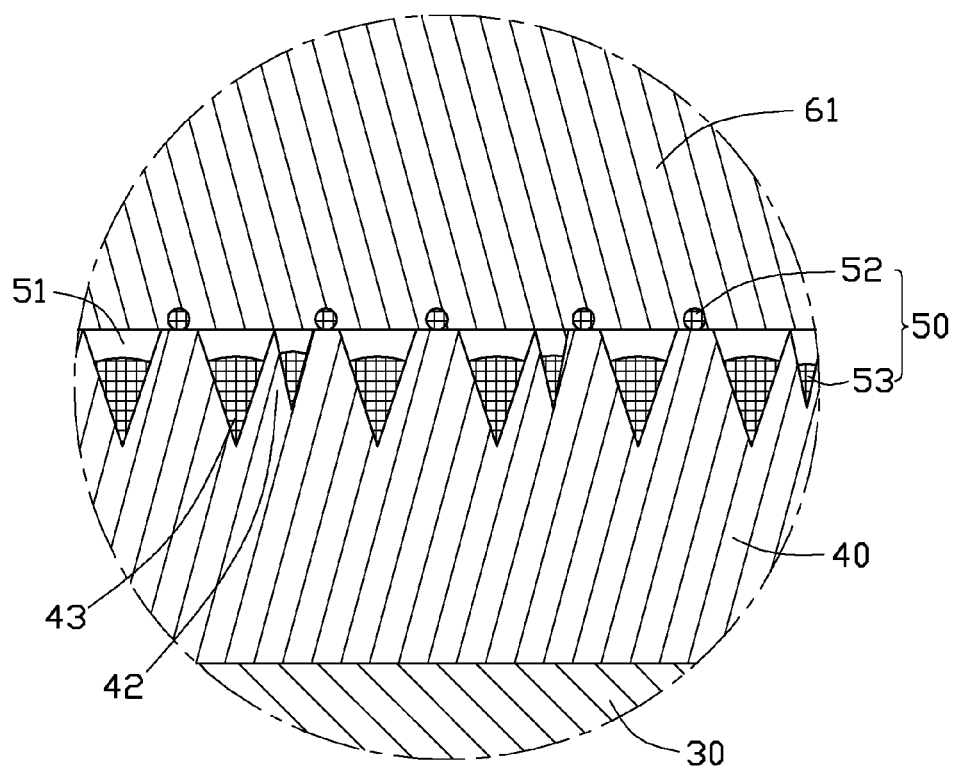
FIG. 2 is an enlarged view of a circled portion II of the LED of FIG. 1.

Referring to FIG. 1 and FIG. 2, an LED 100 in accordance with one embodiment of the disclosure includes a substrate 10, a buffer layer 20 disposed on the substrate 10, a first transitional layer 30 disposed on the buffer layer 20, a second transitional layer 40 disposed on the first transitional layer 30, an aluminum nitride (AlN) material 50, and an epitaxial layer 60 disposed on the second transitional layer 40 and covering the AlN material 50.

In the embodiment, the substrate 10 is made of sapphire ($Al_2O_3$). Alternatively, the substrate 10 also can be made of silicon carbide (SiC), silicon or gallium nitride (GaN).

The buffer layer 20, the first transitional layer 30 and the second transitional layer 40 are sequentially disposed on the substrate 10, by metal-organic chemical vapor deposition (MOCVD), molecular beam epitaxy (MBE) or hydride vapor phase epitaxy (HVPE). In this embodiment, the first transitional layer 30 and the second transitional layer 40 are made of un-doped GaN. Specifically, a top surface of the first transitional layer 30 is smooth and flat. A top surface of the second transitional layer 40 is rugged. The rugged top surface of the second transitional layer 40 includes a planar area 41 and a patterned area 42 alternate with the planar area 41. The patterned area 42 includes a plurality of protrusions. A groove 43 is defined between every two adjacent protrusions.

The AlN material 50 is located between the second transitional layer 40 and the epitaxial layer 60. The AlN material 50 includes a first part 52 consisting of a plurality of spheres discretely formed in a bottom of the epitaxial layer 60 and on a top face of the second transitional layer 40 and a second part 53 consisting of a plurality of slugs discretely formed in the second transitional layer 40. The spheres of the first part 52 are separated from the slugs of the second part 53 in the patterned area 42, wherein at least one slug is located between two neighboring spheres of the first part 52. At the planar area 41, there is no the second part 53 of the AlN material 50; only the first part 52 of the AlN material 50 exists at the planar area 41. The spheres of the first part 52 at the planar area 41 are separated from each other. Alternatively, the first part 52 can consist of a plurality of pyramidal or cylindrical masses. The slugs of the second part 53 are in the grooves 43 of the patterned area 42. Each slug of the second part 53 is fittingly received in a corresponding groove 43 and has a shape matching with a shape of the corresponding groove 43. The second part 53 of the AlN material 50 does not completely fill the grooves 43, such that the second part 53 of the AlN material 50 in the grooves 43 is spaced from the epitaxial layer 60 by a gap 51 in each groove 43.

The epitaxial layer 60 includes a first semiconductor layer 61, a light emitting layer 62 and a second semiconductor layer 63 sequentially disposed on the second transitional layer 40. The first semiconductor layer 61 receives the first part 52 therein. The first semiconductor layer 61 is located on the planar area 41 and the patterned area 42 of the second transitional layer 40, and spaced from the second part 53 in the grooves 43 by the gaps 51. In this embodiment, the first semiconductor layer 61 is an N-type GaN layer, the light emitting layer 62 is a multiple quantum well (MQW) GaN/InGaN layer, and the second semiconductor layer 63 is a P-type GaN layer. The second semiconductor layer 63 includes a P-type blocking layer 631 on the light emitting layer 62 and a P-type contacting layer 632 on the P-type blocking layer 631. In this embodiment, the P-type blocking layer 631 is made of P-type aluminum gallium nitride (AlGaN), and the P-type contacting layer 632 is made of P-type GaN. When electrons inside the first semiconductor layer 61 jump to electric holes inside the second semiconductor layer 63 by excitation of an electric field, photons are emitted from the light emitting layer 62 where the conjunctions of the electrons and the electric holes occur. The AlN material 50 reflects a part of radiant light emitted from the light emitting layer 62 facing the substrate 10, and then directs the radiant light out of the LED 100 in a normal direction, which is directly out of a top surface of the LED 100. Thus, a light emitting efficiency of the LED 100 can be enhanced.

The LED 100 further includes a first electrode 71 and a second electrode 72. The first electrode 71 is disposed on a part of the first semiconductor layer 61 which is exposed upwardly. The second electrode 72 is disposed on a top surface of the P-type contacting layer 632 of the second semiconductor layer 63. The first and second electrodes 71, 72 direct an inducting current into and out of the LED 100 for producing the electric field. In this embodiment, the first electrode 71 is a cathode and the second electrode 72 is an anode. In addition, a transparent conductive layer (not shown) can be formed between the second electrode 72 and the second semiconductor layer 63 for evenly inducting current into the LED 100. The transparent conductive layer can be made of indium tin oxide (ITO) or an alloy of nickel and gold (Ni/Au).

Figure 3:
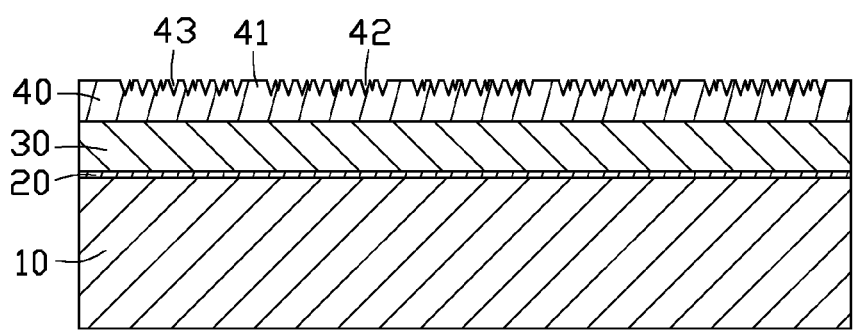
FIG. 3 is a cross-sectional view showing a step of providing a substrate and two transitional layers sequentially disposed on the substrate in accordance with a manufacturing method of the LED of the disclosure.

The disclosure provides a manufacturing method for the LED 100 which includes following steps:

Referring to FIG. 3, a substrate 10 is provided. In this embodiment, the substrate 10 is made of sapphire ($Al_2O_3$). Alternatively, the substrate 10 can also be made of SiC, silicon or GaN.

Thereafter, a buffer layer 20, a first transitional layer 30 and a second transitional layer 40 are sequentially formed on the substrate 10 by metal-organic chemical vapor deposition (MOCVD), molecular beam epitaxy (MBE) or hydride vapor phase epitaxy (HVPE). In this embodiment, the first transitional layer 30 and the second transitional layer 40 are undoped GaN layers. The first transitional layer 30 is formed at a temperature from 1000 to 1200 degrees centigrade ( ), and the second transitional payer 40 is formed at a temperature from 700 to 900. In this embodiment, the temperature for forming the first transitional layer 30 is 1150 degrees centigrade, and the temperature for forming the second transitional payer 40 is 850 degrees centigrade. The top surface of the first transitional layer 30 is smooth and flat, and the top surface of the second transitional layer is rugged. The rugged top surface of the second transitional layer 40 includes a planar area 41 and a patterned area 42. The patterned area 42 includes a plurality of protrusions, and at least a groove 43 is defined between every two adjacent protrusions.

Figure 4:
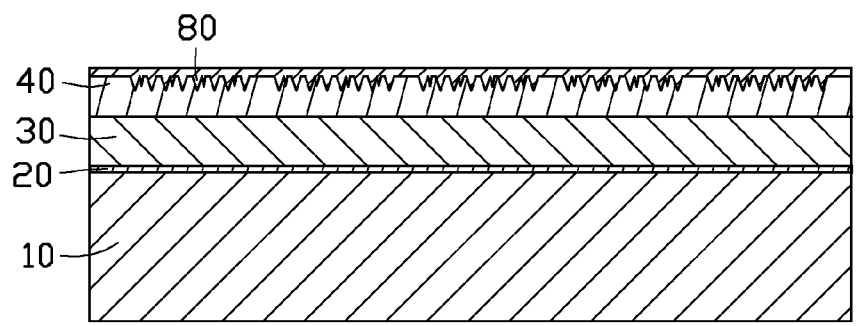
FIG. 4 is a cross-sectional view showing a step of coating an aluminum layer on the transitional layers of FIG. 3.

Referring to FIG. 4, an aluminum layer 80 is coated on the top surface of the second transitional layer 40. In this embodiment, the aluminum layer 80 can be formed by vapor deposition vapor deposition, evaporation or sputtering; a thickness of the aluminum layer 80 is 500 A.

Figure 5:
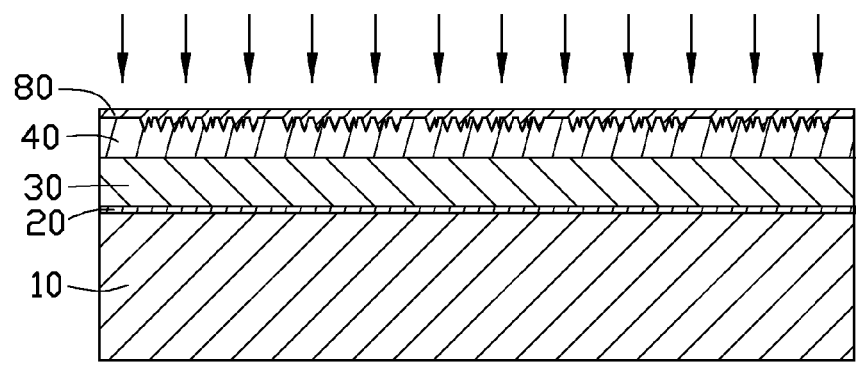
FIG. 5 to FIG. 7 are cross-sectional views showing steps of forming different elements in sequence on the aluminum nitride layer of FIG. 4.

Referring to FIG. 5, an outer surface of the aluminum layer 80 is subjected to a nitrogen treatment. In this embodiment, the nitriding process is achieved by MOCVD, and a temperature in nitriding the aluminum layer 80 is about 700. In the nitriding process, when the aluminum layer 80 is heated at a temperature of about 660, the aluminum layer 80 is melted, with a part thereof on the planar area 41 being turned into a plurality of aluminum spheres and another part thereof on the patterned area 42 flowing into the grooves 43; when the aluminum layer 80 is heated at a temperature of about 700, ammonia ($NH_3$) gas is infused over the melted aluminum layer 80, and reacts with the melted aluminum layer 80 to form AlN material 50. Such that, the AlN material 50 includes a first part 52 located on the planar area 41 and the patterned area 42, and a second part 53 located at the patterned area 42 only. The first part 52 consists of a plurality of spaced spheres, and a diameter of each sphere is from 50 to 100 nm. The second part 53 consists of a plurality of slugs conformably received in the grooves 43, respectively, without completely filling the grooves 43.

Figure 6:
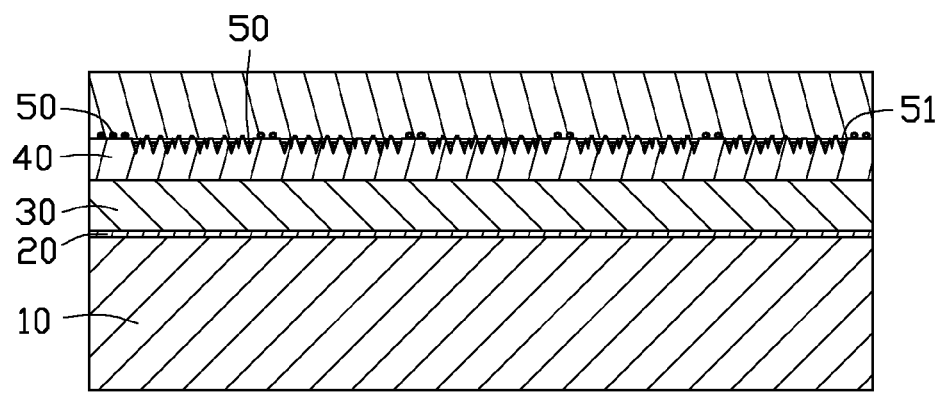
Figure 7:
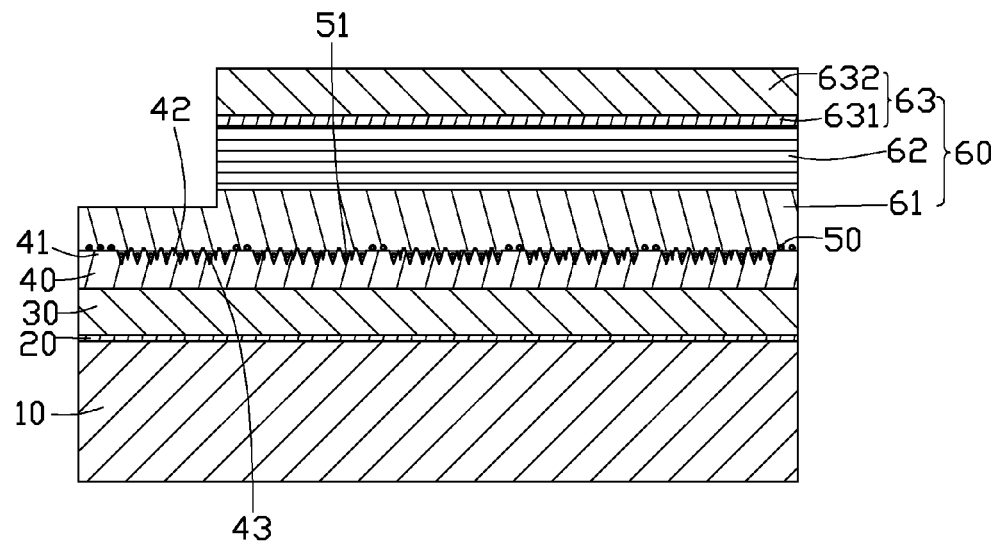

Referring to FIG. 6 and FIG. 7, an epitaxial layer 60 is formed on the second transitional layer 40 and cover the AlN material 50. The epitaxial layer 60 includes a first semiconductor layer 61, a light emitting layer 62, and a second semiconductor layer 63 sequentially disposed on the second transitional layer 40. The epitaxial layer 60 can be formed by MOCVD, MBE, or HYPE. In this embodiment. The first semiconductor layer 61 is located on both the planar area 41 and the patterned area 42 of the second transitional layer 40. The first semiconductor layer 61 receives the first part 52 therein and is spaced from the second part 53 by gaps 51 (better seen in FIG. 2). In this embodiment, the epitaxial layer 60 is made of GaN, the first semiconductor layer 61 is an N-type GaN layer, the light emitting layer 62 is a MQW GaN layer, and the second semiconductor layer 63 is a P-type GaN layer. The second semiconductor layer 63 consists of a P-type blocking layer 631 on the light emitting layer 62 and a P-type contacting layer 632 on the P-type blocking layer 631. In the embodiment, the P-type blocking layer 631 is made of AlGaN and the P-type contacting layer 632 is made of GaN.

Figure 8:
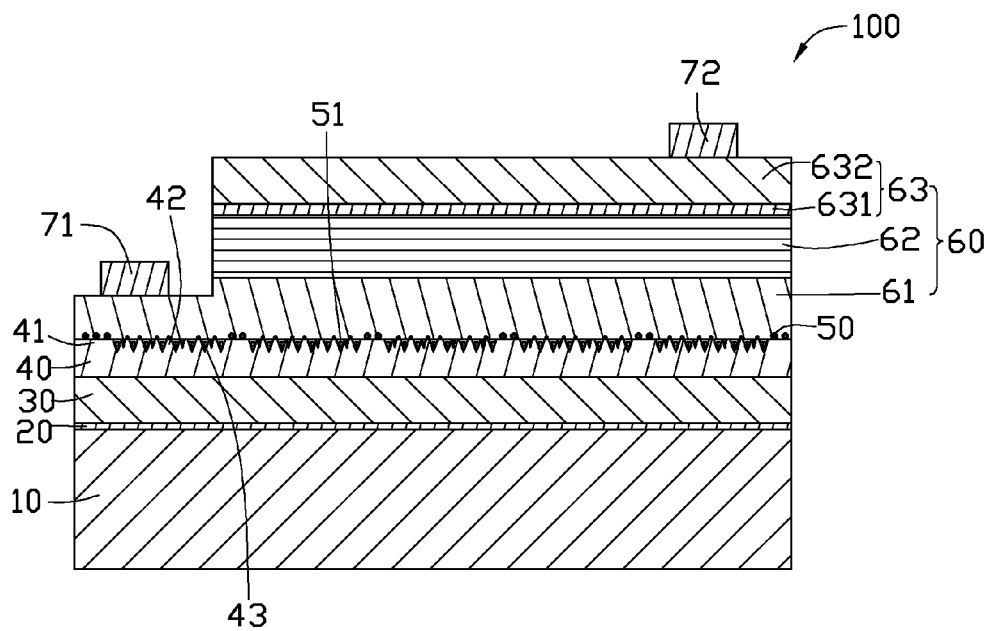
FIG. 8 is a cross-sectional view showing a step of forming two electrodes on an epitaxial layer of FIG. 7 to complete the formation of the LED of FIG. 1.

Referring to FIG. 8, a first electrode 71 and a second electrode 72 are respectively formed on the first semiconductor layer 61 and the second semiconductor layer 63. Vapor deposition or sputter can be used to form the first and the second electrodes 71, 72. Moreover, the first electrode 71 and second electrode 72 can be titanium, aluminum, silver, nickel, tungsten, copper, palladium, chromium, gold or an alloy thereof.

Furthermore, for providing an inducting current evenly flowing into the LED 100, a transparent conductive layer (not shown) can be disposed between the second electrode 72 and the second semiconductor layer 63. The transparent conductive layer can be made of ITO or Ni/Au alloy.

The LED 100 includes the first and second transitional layers 30, 40 and the AlN material 50 consisting of a plurality of spheres and slugs disposed on/in the second transitional layer 40. When radiant light emitted downwardly from the light emitting layer 62 reaches the second transitional layer 40, since the surface of each sphere of the first part 52 of the AlN material 50 is curved, the radiant light reflected from the first part 52 has a lager incident angle to direct into the first semiconductor layer 61. Therefore, total reflections inside the LED 100 can be increased that the light extraction and the light intensity of the LED 100 are enhanced further. Furthermore, when the radiant light emitted downwardly from the light emitting layer 62 reaches the patterned area 42, since the second part 53 in the grooves 43 is spaced from the first semiconductor layer 61 by the gaps 51 which are filled with air, and since a refractivity of GaN (n=2.4) is quite large than a refractivity of the air (n=1.0), the radiant light is easier to be totally reflected at an interface of the first semiconductor layer 61 and the air, whereby the light extraction efficiency of the LED 100 is further increased.

That is, in the patterned area 42 of the second transitional layer 40, at least one groove 43 which has a slug of the second part 53 of AlN material 50 therein is located between two spheres of the first part 52 of AlN material 50, radiant light emitted downwardly from the light emitting layer 62 to the substrate 10 is easier to be totally reflected to the light output top surface of the LED 100, and an increase in intensity of the output light of the LED 100 is obtained. Furthermore, the uniformity of the output light of LED 100 can be improved by the arrangement of the spheres and slugs of the first and second parts 52, 53 of the AlN material 50.

It is to be understood that the above-described embodiments are intended to illustrate rather than limit the disclosure. Variations may be made to the embodiments without departing from the spirit of the disclosure as claimed. The above-described embodiments illustrate the scope of the disclosure but do not restrict the scope of the disclosure.

What is claimed is:

1. A manufacturing method for an LED (light emitting diode) comprising following steps:
providing a substrate;
disposing a transitional layer on the substrate, the transitional layer comprising a planar area with a flat top surface and a patterned area with a rugged top surface, wherein the patterned area and the planar area are arranged alternately, the patterned area comprising a plurality of protrusions, and a groove being defined between every two adjacent protrusions;
coating an aluminum layer on the transitional layer;
using a nitriding process on the aluminum layer to form an AlN material on the transitional layer, the AlN material having first part located on the planar area and the patterned area and second part located in the patterned area, the first part consisting of the a plurality of separated masses each being spherical, pyramid or cylindrical, the second part consisting of a plurality of slugs;
disposing an epitaxial layer on the transitional layer and covering the AlN material, the epitaxial layer contacting the planar area and the patterned area of the transitional layer, a plurality of gaps being defined between the epitaxial layer and the slugs of the second part of the AlN material in the patterned area of the transitional layer.

2. The manufacturing method for an LED of claim 1, wherein the step of forming an epitaxial layer comprises disposing a first semiconductor layer, a light emitting layer and a second semiconductor layer sequentially on the transitional layer, and the step of forming an epitaxial layer further comprises forming a first electrode on the first semiconductor layer and a second electrode on the second semiconductor layer.

3. The manufacturing method for an LED of claim 1, further comprising disposing an additional transitional layer between the substrate and the transitional layer.

4. The manufacturing method for an LED of claim 1, wherein the transitional layer and the additional transitional layer are made of un-doped GaN (gallium nitride) or n-type GaN material.

5. The manufacturing method for an LED of claim 3, wherein the transitional layer is formed under a temperature of 1000 to 1200 degrees centigrade, and the additional transitional layer is formed under a temperature of 750 to 900 degrees centigrade.

6. The manufacturing method for an LED of claim 3, wherein the epitaxial layer is formed under a temperature of 1000 to 1200 degrees centigrade.

7. The manufacturing method for an LED of claim 1, wherein a thickness of the aluminum layer is 500 A.

8. The manufacturing method for an LED of claim 1, wherein each groove receives a corresponding slug of the second part of the AlN material therein, the gaps each being formed between the AlN material in a corresponding groove and the epitaxial layer.

9. The manufacturing method for an LED of claim 1, wherein the substrate is sapphire ($Al_2O_3$), silicon carbide (SiC), silicon or gallium nitride (GaN).

10. The manufacturing method for an LED of claim 2, wherein the masses of the first part of the AlN material each are spherical, pyramid or cylindrical.

11. The manufacturing method for an LED of claim 5, wherein the temperature for forming the transitional layer is 1150 degrees centigrade, and the temperature for forming the additional transitional payer is 850 degrees centigrade.

12. The manufacturing method for an LED of claim 1, wherein the slugs of the second part are in the grooves of the patterned area, each slug of the second part is fittingly received in a corresponding groove and having a shape matching with a shape of the corresponding groove.

13. The manufacturing method for an LED of claim 2, wherein the first semiconductor layer is an N-type GaN layer, the light emitting layer being a multiple quantum well (MQW) GaN/InGaN layer, the second semiconductor layer being a P-type GaN layer.

14. The manufacturing method for an LED of claim 2, wherein the step of forming the second semiconductor layer comprises forming a P-type blocking layer on the light emitting layer and a P-type contacting layer on the P-type blocking layer.

* * * * *